United States Patent [19]

Lee

[11] Patent Number: 5,572,071
[45] Date of Patent: Nov. 5, 1996

[54] SEMICONDUCTOR DEVICE HAVING A MULTI-LAYER METALLIZATION STRUCTURE

[75] Inventor: Sang-in Lee, Kyungki-do, Rep. of Korea

[73] Assignee: Samsung Electronics Co., Ltd., Suwon, Rep. of Korea

[21] Appl. No.: 476,738

[22] Filed: Jun. 7, 1995

Related U.S. Application Data

[62] Division of Ser. No. 341,982, Nov. 16, 1994, which is a division of Ser. No. 172,216, Dec. 23, 1993.

[30] Foreign Application Priority Data

Dec. 30, 1992 [KR] Rep. of Korea ............ 92-26603

[51] Int. Cl.⁶ ................... H01L 29/41; H01L 29/43
[52] U.S. Cl. ............... 257/751; 257/753; 257/762; 257/763; 257/764; 257/915
[58] Field of Search ..................... 257/750, 751, 257/753, 758, 762–765, 767, 768, 773, 915, 754

[56] References Cited

U.S. PATENT DOCUMENTS

| | | | |
|---|---|---|---|
| 5,202,579 | 4/1993 | Fujii et al. | 257/915 |
| 5,254,872 | 10/1993 | Yoda et al. | 257/751 |
| 5,360,996 | 11/1994 | Nulman et al. | 257/915 |
| 5,381,040 | 1/1995 | Sun et al. | 257/753 |

FOREIGN PATENT DOCUMENTS

| | | |
|---|---|---|
| 0109341 | 5/1987 | Japan . |
| 0132848 | 6/1987 | Japan . |
| 0099549 | 4/1988 | Japan . |

*Primary Examiner*—Peter Toby Brown
*Attorney, Agent, or Firm*—Cushman Darby & Cushman, L.L.P.

[57] ABSTRACT

The invention relates to a wiring structure for a semiconductor device and a method for manufacturing the same, which fills up a contact hole of below one half micron. An insulating layer is formed on a semiconductor substrate, and a contact hole is formed in the insulating layer. On the insulating layer, a first metal is deposited via a CVD method to form a CVD metal layer or a CVD metal plug filling up the contact hole. Then, the thus-obtained CVD metal layer or the CVD metal plus is heat-treated in a vacuum at a high temperature below the melting point of the first metal, thereby planarizing the surface of the CVD metal layer. A second metal is deposited via a sputtering method on the CVD metal layer or on the CVD metal plug to thereby form a sputtered metal layer. The contact hole is filled up with the first metal by the CVD method and then a reliable sputtered metal layer is deposited via a sputtering method. The wiring layer can be used for semiconductor devices of the next generation.

13 Claims, 5 Drawing Sheets

SEMICONDUCTOR DEVICE HAVING A MULTI-LAYER METALLIZATION STRUCTURE

This application is a division of Ser. No. 08/341,982, filed 16 Nov. 1994, which is a division of Ser. No. 08/172,216, filed 23 Dec. 1993.

BACKGROUND OF THE INVENTION

The present invention relates to a semiconductor device and a method for manufacturing the same, and more particularly, to a semiconductor device having a wiring layer structure and a method for manufacturing the same.

In less-dense conventional semiconductor devices, metal step coverage has not been a serious problem. However, recently, with increased integration density in semiconductor devices, the diameter of contact holes has become significantly smaller, to half-micron dimensions, while the aspect ratio thereof has become much larger and the impurity-doped regions formed in the semiconductor substrate have become much shallower. Accordingly, it has become necessary to improve on the conventional method for forming a wiring layer structure using aluminum (Al), since filling up a contact hole of 0.5 μm or below having an aspect ratio of two or greater is difficult and metal wiring layer structure reliability will be deteriorated due to void formation. These days, the wiring method for a semiconductor device is regarded as being most important in the process semiconductor manufacturing process, since it determines the speed, yield, and the reliability of the semiconductor device.

To solve such problems as void formation caused by the high aspect ratio and the poor step coverage of the sputtered aluminum, a method for filling up the contact hole by melting aluminum is proposed. For example, Japanese Laid-open Publication No. 62-132848 (by Yukiyasu Sugano et al.), Japanese Laid-open Publication No. 63-99549 (by Shinpei Iijima et al.), and Japanese Laid-open Publication No. 62, 109341 (by Misahiro Shimizu et al.) disclose a melting method. According to the above publications, the contact hole is filled up by depositing aluminum or an aluminum alloy and heating aluminum beyond its melting point and then, reflowing the liquid aluminum. In addition to the above disclosures, U.S. Pat. Nos. 4,920,027 (by Ryoichi Mukai), 4,800,179 (by Ryoichi Mukai) and 4,758,533 (by Magee Thomas et al.) disclose a method for forming a planarized metal layer by depositing the metal layer and heating to melt it using a laser beam.

According to the above methods, the semiconductor wafer has to be disposed horizontally so as to allow proper filling of the contact hole with the flowing melted aluminum. Then, the liquid metal layer will try to seek a lower surface tension, and thus, may shrink or warp when solidified, thereby exposing the underlying semiconductor material. Further, the heat treatment temperature cannot be precisely controlled and therefore, it is difficult to reproduce the desired results. Moreover, the areas of the metal layer beside the contact hole become rough, which causes problems in the subsequent photolithography process.

A multiple step metallization process is disclosed in U.S. Pat. No. 4,970,176 (by Tracy et al.), wherein a thick metal layer having a predetermined thickness is deposited on a semiconductor wafer at a low temperature (below 200° C. approximately). Then, the remaining and relatively thin metal layer is deposited on a semiconductor wafer while the temperature is increased to approximately 400° C. to 500° C. The reflow of the deposited metal layer takes place through grain growth, re-crystallization and bulk diffusion, which improves the step coverage of the metal layer.

However, a contact hole whose diameter is 1 μm or below cannot be completely filled up by aluminum or an aluminum allow. Therefore, the above method is not suitable for filling up the contact hole of a highly integrated semiconductor device.

Meanwhile, Ono et al. have disclosed that when the temperature of Al—Si film is above 500° C., the liquidity of Al—Si suddenly increases. They disclosed a method that fills up the contact hole by depositing Al-Si film at a temperature of 500°–550° C. (see Hisako Ono et al., in Proc. 1990 VMIC Conference June 11–12, pp. 76–82). U.S. Pat. No. 5,071,791 (by Inoue Minoru et al.) discloses a method for forming a wiring layer which has a good step coverage and a planarized surface by depositing an Al alloy and then heating the wafer beyond a predetermined temperature.

Additionally, Yoda Dakashi et al. have suggested a method for filling up the contact hole by depositing metal at a temperature of 500°–550° (European Patent Application No. 80104184.8 corresponding to Japanese Patent Application No. 89-61557). According to the Yoda Dakashi method, the contact hole may be completed filled up by the metal. However, there is a high probability that the Al—Si film has a strong resistance against the electron migration but a weak resistance against stress. In addition to this, Si included in Al film is crystallized at the interfaces between Al—Si grains, which is undesirable. Thus, it is necessary to remove the Al—Si film at the areas other than the contact hole area, and the metallization process becomes complicated.

Additionally, C. S. Park et al. (which includes the present inventor) have disclosed a method for forming a metal wiring layer which comprises the steps of depositing an aluminum alloy at a low temperature of 100° C. or below, and performing a heat treatment for approximately three minutes at a temperature of 550° C., i.e., a temperature below the melting point, to thereby completely fill up the contact hole with aluminum alloy (see Proc. 1991 VMIC Conference, June 11 and 12, pp. 326–328). This method is included in U.S. patent application Ser. No. 07/897,294 filed on Aug. 24, 1992 (as a continuation-in-part of U.S. patent application Ser. No. 07/585,218 entitled "A Method for Forming a Metal Layer in a Semiconductor Device" and filed on Sep. 19, 1990). The aluminum deposited at a low temperature is not melted during heat treatment at 550° C., but migrates into the contact hole, thereby completely filling the contact hole.

According to the C. S. Park et al. method, the contact hole, having a size of 0.8 μm and an aspect ratio of approximately 1.0, can be completely filled up by performing a heat treatment even after aluminum is deposited to a thickness of approximately 500 Å at a low temperature of 100° C. or below. This method does not require the etching process described in the Yoda Dakashi et al. patent. In addition, this method can fill up the contact hole by forming a very thin Al film and then heat-treating. Therefore, the smaller-sized contact holes expected in the future can be filled up with Al or Al alloy in the recent semiconductor process where the size of the contact hole is becoming smaller. For these advantages, a method for filling up the contact hole by the C. S. Park method is attracting a great deal of interest in the pertinent art.

As described above, Al or an Al alloy is generally deposited by a sputtering method which can produce a wiring layer having a good resistance against electro-migration. However, the sputtering method has a step coverage problem, as described above, and the development of other depositing methods thus become necessary. Methods where a void is completely filled by depositing Al using a chemical vapor deposition (CVD) method, have been suggested. For example, U.S. Pat. Nos. 4,460,610 and 4,433,012 (both by Heinecke et al.) disclose a method for depositing Al by thermally decomposing a triisobutyl aluminum (hereinafter referred to as "TIBA") through a CVD method.

The representative method for depositing Al using the CVD method is that, as described above, an organic Al precursor is volatilized and then thermally decomposed to thereby deposit Al. Representative organic Al precursors include TIBA, dimethyl aluminum hydride (DMAH, $(CH_6)_2AlH$) etc.

In general, when Al is deposited by a low-pressure CVD method using TIBA, at the substrate temperature of 260° C., while maintaining the vapor temperature of TIBA at 45° C. and using approximately 1Torr, the Al deposition rate is 1,500 Å/minute.

Referring to the method of depositing Al using the CVD method, the step coverage of CVD-deposited aluminum (hereinafter referred to as "CVD-Al") is excellent. However, the surface of the obtained CVD-Al layer is rough which causes problems in the subsequent lithography process. Further, the wiring layer formed from the CVD-Al layer has a very poor resistance against electron-migration and the reliability thereof is insufficient. Moreover, Al cannot be deposited in the form of Al—Si alloy by a CVD method. (see Silicon Processing for the VLSi Era, Vol. 2, by S. Wolf, p. 254).

In order to improve the uniformity of the obtained CVD-Al film, a method for promoting the nucleation of Al in the CVD method by exposing the wafer to a $TiCl_4$ atmosphere to thereby pretreat the surface of the substrate was proposed (see U.S. Pat. No. 4,460,618). Also, a method which uses Al hydrides such as DMAH, $AlH_2(i-C_4H_4)$ or $AlH_2Cl$ as a source was proposed (see U.S. Pat. No. 3,462,288).

Additionally, U.S. Pat. No. 4,328,261 discloses a method for depositing Al, using silane and Al alkyl gas as a source, by a CVD method at a high temperature and at a low pressure, so as to form a film comprised of Al—Si alloy.

U.S. Pat. No. 4,923,717 discloses a method for forming Al film. A mirror-like Al is deposited on the surface of the substrate, the substrate is treated using an IVB or VB group metal complex compound such as $TiCl_4$, and then an Al hydride is decomposed to thereby form the Al film. However, by using the method of pre-treatment including $TiCl_4$, the remaining chlorine causes a corrosion problem.

As stated above, since the process for depositing Al using a CVD method has many problems, it is not widely used.

It is known that a diffusion barrier layer can be formed between the wiring layer and the silicon wafer or an insulating layer, so as to prevent Al spiking. Si precipitates and Si-nodule formation is caused by the above-mentioned reaction between the metal wiring layer and the silicon wafer. For example, U.S. Pat. No. 4,897,709 (by Yokoyama et al.) describes a method for forming a nitride titanium film as a diffusion barrier layer on the inner walls of the contact hole. Additionally, in Japanese Laid-open Publication No. 61-183942, a method is described for forming a barrier layer which comprises the steps of forming a refractory metal layer, depositing a metal such as Mo, W, Ti or Ta, forming a titanium nitride layer on the refractory metal layer and heat-treating the double layer which consists of a refractory metal layer and a nitride titanium layer to thereby form a refractory metal silicide layer consisting of thermally stable compounds at the inter-surface of the refractory metal layer and semiconductor substrate by a reaction therebetween. Thus, the barrier characteristic is improved. This heat treatment of the diffusion barrier layer is performed by an annealing process under a nitrogen atmosphere. When the diffusion barrier layer does not undergo the annealing process, junction spiking occurs in a subsequent sintering step after Al sputtering, or during sputtering Al or an Al alloy at a temperature above 450° C., which is undesirable.

Additionally, Hagita Masafumi has suggested a method wherein a TiN layer as a barrier layer is heat-treated, and then, the barrier layer is implanted with $O_2$ or silicon in order to improve the wettability between the barrier metal and the Al wiring and to improve the quality and yield of the wiring (Japanese Laid-open Publication No. 2-26052).

Also, Nishima Kenji et al. have suggested a method for improving a barrier characteristic upon forming a diffusion barrier layer. This method comprises the steps of forming a TiN layer and then heat-treating, and forming a TiN layer again (Japanese Laid-open Publication No. 63-97762).

Besides the method for preventing Al spiking or Si precipitate crystallization by improving the characteristic of a diffusion barrier layer as described above, a method for preventing Al spiking or Si precipitates by forming a composite layer having various compositions as an Al wiring layer has also been suggested.

For example, a method for preventing Si-precipitates in a sintering process when a wiring layer is formed is disclosed in Japanese Laid-open Publication No. 2-159065 (by Michiichi Masmoto). This method comprises the steps of forming an Al—Si film first and then forming a pure Al layer, thereby preventing Si-precipitates in the sintering process. Further, U.S. patent application Ser. Nos. 07/828,458 (filed on Jan. 31, 1992 and now pending in the USPTO) and 07/910,895 (filed on Jul. 8, 1992 and now pending in the USPTO) by S. I. Lee (the present inventor) et al. disclose a method for forming a composite layer so as to prevent the crystallization of Si precipitates generated when the contact hole is filled by depositing Al at a low temperature and heat-treating at a high temperature below the melting point according to the C. S. Park et al. method.

Generally, in order to form a metal layer after forming a diffusion barrier layer, the wafer is exposed to the atmosphere since the wafer should be transferred to sputtering equipment to form the metal layer.

At this time, oxidation occurs in the interfaces of the grains or in the surface portion of the diffusion barrier layer, and the mobility of aluminum atoms on the oxidized diffusion barrier layer is decreased. When an Al-1% Si-0.5% Cu alloy is deposited to a thickness of 6,000 Å at room temperature, the formed grains are small, i.e., approximately 0.2 μm.

Meanwhile, large grains of up to approximately 1 μm are formed on the diffusion barrier layer unexposed to the atmosphere. Aluminum reacts with the diffusion barrier layer during a heat-treating step at a high temperature or when depositing an Al film by sputtering at a high temperature, to thereby make the surface of the Al film very rough, which deteriorates surface reflectivity. As a result, the subsequent photolithography process is difficult to perform.

In general, a titanium nitride (TIN) layer or TiW (or TiW(N)) layer is used as the diffusion barrier layer. Such layers have micro-structured defects or grain boundaries which cannot prevent silicon or Al diffusion at the grain boundary when forming a thin film of the diffusion barrier layer. A method for blocking a diffusion path in the grain boundary according to the "oxygen stuffing" method has been suggested. When the diffusion barrier layer is exposed to a $N_2$ annealing process or to the atmosphere, a small amount of oxygen is mixed into the barrier layer, to thereby increase the diffusion barrier effect. This is called the "stuffing effect."

Generally, when TiN is deposited and exposed to the atmosphere, a stuffing effect occurs due to the oxygen in the atmosphere. The method of the Hagita patent also oxygenates the surface of the diffusion barrier layer, thereby improving the characteristics of the barrier metal.

However, the contact resistance can be increased when Ti or TiN is deposited so as to form a barrier layer which is then exposed to the atmosphere, when TiN is deposited while introducing the oxygen, or when the barrier layer is annealed under the nitrogen atmosphere wherein oxygen is introduced.

It is desirable to form an oxide on the surface of the diffusion barrier layer and in the grain boundary thereof, to improve the characteristics of the diffusion barrier layer in the contact hole. However, this oxide may deteriorate the wettability of the diffusion barrier layer and the Al so that a void may be formed in the contact hole, or a metal layer which has a poor profile during heat treatment may be formed, which thereby deteriorates the reliability of the wiring layer of the semiconductor device.

FIGS. 1 to 3 illustrate defects of a wiring layer which can be generated when the contact hole is filled up by depositing Al using the conventional method.

FIGS. 1 to 3, reference numeral 1 is a semiconductor wafer, reference numeral 2 is an impurity-doped region, reference numeral 3 is an insulating layer (BPSG film), reference numeral 4 is a diffusion barrier layer, and reference numeral 6 is an Al alloy metal layer. FIG. 1 illustrates the profile of the deposited Al obtained by a conventional sputtering method. FIG. 2 illustrates an Al layer 6 obtained by depositing Al using the above CVD method, and FIG. 3 illustrates a void 7 in the contact hole when Al is deposited and heat-treated in a vacuum or when the contact hole is filled up by a high-temperature sputtering method.

As described above, according to the conventional method of FIG. 1, it is very hard to fill up the contact hole which has a high aspect ratio and whose size is below one-half micron, since the step coverage of the sputtered Al is poor. The reliability of the CVD-Al layer is unacceptable, which causes difficulty in applying it to an actual semiconductor device. According to a method wherein the contact hole is filled up by depositing Al at a low temperature and heat-treated in a vacuum, the deposition and heat-treatment steps have to be performed repeatedly so as to fill up the small and deep contact hole. Therefore, the throughput is lowered.

SUMMARY OF THE INVENTION

Accordingly, it is an object of the present invention to provide a novel wiring layer structure having a contact hole smaller than one half micron and a method for manufacturing the same.

It is another object of the present invention to provide a semiconductor device which has a diffusion barrier layer, wherein the above stuffing effect is maintained and a reliable wiring layer is obtained, by completely filling up a contact hole whose size is below one half micron, and a method for manufacturing the same.

To accomplish the above first object of the present invention, there is provided a semiconductor device having a wiring comprising: an insulating layer having a recessed portion formed on a semiconductor substrate; a chemical vapor deposition (CVD) metal layer completely filling up the recessed portion and having a planarized surface; and a sputtered metal layer formed on the CVD metal layer. The recessed portion may be a contact hole for exposing an impurity-doped region formed in the semiconductor substrate, for electrically connecting upper and lower conductive layers of the semiconductor device, or a groove formed where the wiring is to be formed.

The present invention further provides a semiconductor device having a wiring comprising: an insulating layer having an opening formed on a semiconductor substrate; a CVD metal plug completely filling up the opening and having a planarized surface; and a sputtered metal layer formed on the CVD metal plug and on the insulating layer.

The wiring of the present invention may be applied to a sub-micron contact hole having a low aspect ratio. However, the wiring of the present invention is advantageously applicable to a contact hole which has a high aspect ratio and a size below one half micron, and particularly an aspect ratio of 2.0 to 6.0 and a size of 0.2 to 0.6 μmm, which is required for higher integration semiconductor devices.

According to one embodiment of the present invention, a diffusion barrier layer may be formed under the CVD metal layer or the CVD metal plug for preventing the reaction between the insulating layer and the CVD metal layer (or the CVD metal plug). The diffusion barrier layer is preferably formed by expanding to the inner surface of the recessed portion.

According to another embodiment of the present invention, the diffusion barrier layer is formed on the inner surface of the recessed portion and on the insulating layer.

In the present invention, the diffusion barrier layer may be comprised of a refractory metal or a refractory metal compound. The diffusion barrier layer is preferably a composite layer consisting of a first diffusion barrier layer comprised of a refractory metal and a second diffusion barrier layer comprised of a refractory metal compound.

According to a preferred embodiment of the present invention, a nucleation layer is formed under the CVD metal layer or under the CVD metal plug. The nucleation layer may be comprised of silicon, copper or a combination thereof, and the nucleation layer may be comprised of a refractory metal or a refractory metal compound. Further, the nucleation layer may be a hydrogen-treated layer or a silylation layer.

According to one preferred embodiment of the present invention, an intermediate layer is formed between the CVD metal layer or the CVD metal plug and the sputtered metal layer. The intermediate layer may be a third diffusion barrier layer having (111) orientation. The intermediate layer may be formed by using silicon, a refractory metal or a refractory metal compound.

The present invention provides a semiconductor device comprising: an insulating layer having an opening formed on a semiconductor substrate; a diffusion barrier layer formed on the inner and bottom surfaces of the opening and on the insulating layer; a nucleation layer formed on the diffusion barrier layer; a CVD metal layer which completely fills up the opening and has a planarized surface; an intermediate layer formed on the CVD metal layer; and a sputtered metal layer formed on the intermediate layer.

Still further, the present invention provides a semiconductor device comprising: an insulating layer having an opening formed on a semiconductor substrate; a diffusion barrier layer formed inside and on the bottom surface of the opening; a nucleation layer formed on the diffusion barrier layer and on the insulating layer; a CVD metal layer which completely fills up the opening and has a planarized surface; an intermediate layer formed on the CVD metal layer; and a sputtered metal layer formed on the intermediate layer.

And again still further, the present invention provides a semiconductor device comprising: an insulating layer having an opening formed on a semiconductor substrates; a diffusion barrier layer formed on the inner and bottom surface of the opening; a nucleation layer formed on the diffusion barrier layer; a CVD metal plug completely filling up the opening and having a planarized surface; an intermediate layer formed on the CVD metal plug and on the insulating layer; and a sputtered metal layer formed on the intermediate layer.

Further, the present invention provides a semiconductor device comprising: an insulating layer having an opening formed on a semiconductor substrate; a diffusion barrier layer formed on the bottom surface of the opening; a nucleation layer formed on the diffusion barrier layer, on the inner surface of the opening, and on the insulating layer; a CVD metal layer completely filling up the opening and having a planarized surface; an intermediate layer formed on the CVD metal layer, and a sputtered metal layer formed on the intermediate layer.

For accomplishing other objects of the present invention, there is provided a method for manufacturing a semiconductor device having a wiring comprising the steps of: forming an insulating layer having an opening on a semiconductor substrate; forming a CVD metal layer filling up the opening by a CVD method; heat-treating the CVD metal layer to thereby planarize the surface of the CVD metal layer.

The CVD metal layer may be formed by using an organometallic compound such as TIBA, trimethyl aluminum (TMA), DMAH or diisobuthyl aluminum hydride (DIBAH) as a source.

Forming a nucleation layer on the region where the CVD metal layer is expected to be formed enables formation of the CVD metal layer uniformly. The heat-treatment is preferably performed successively at a high temperature below the melting point of the metal which constitutes the CVD metal layer, and without breaking the vacuum. For example, the heat-treatment step is preferably performed at a temperature of 0.6 Tm to Tm (wherein Tm is the melting point of the metal which constitutes the CVD metal layer).

An intermediate layer is preferably formed on the CVD metal layer having a planarized surface, before forming the sputtered metal layer.

According to one embodiment of the present invention, the sputtered metal layer is formed by forming a first sputtered metal layer by firstly depositing a metal to a predetermined thickness at a low temperature, heat-treating the first sputtered metal layer at a high temperature below the melting point, and secondly depositing a metal so that the sputtered metal layer has a predetermined thickness, thereby forming a composite layer.

The present invention further provides a method for manufacturing a semiconductor device having a wiring structure, comprising the steps of: depositing a metal on a semiconductor substrate by a CVD method to form a metal layer; and heat-treating the metal layer at a high temperature below the melting point of the metal to thereby planarize the surface of the metal layer.

Further, the present invention provides a method for manufacturing a semiconductor device having a wiring structure, comprising the steps of: forming an insulating layer having an opening on a semiconductor substrate; forming a CVD metal plug which selectively fills up only the opening by a CVD method; heat-treating the CVD metal plug to planarize the surface of the CVD metal plug; and forming a sputtered metal layer on the CVD metal plug and on the insulating layer by a sputtering method.

Further, the present invention provides a method for manufacturing a semiconductor device having a wiring comprising the steps of: forming an insulating layer on a semiconductor substrate having an impurity-doped region; forming a contact hole exposing the impurity-doped region of the semiconductor substrate in the insulating layer; forming a diffusion barrier layer on the inner surface of the contact hole, on the exposed surface of the semiconductor substrate and on the insulating layer; forming a nucleation layer on the diffusion barrier layer; forming a CVD metal layer filling up the contact hole on the nucleation layer by a CVD method; heat-treating the CVD metal layer to planarize the surface of the CVD metal layer; forming an intermediate layer having a preferred orientation of (iii) on the CVD metal layer having a planarized surface; and forming a sputtered metal layer on the intermediate layer by a sputtering method.

According to the present invention, the contact hole is filled up with a metal by the CVD method and then a reliable sputtered metal layer is deposited via a sputtering method, which enables forming a wiring layer of a semiconductor device which fills up contact holes smaller than one half micron in size. The wiring layer can be used in the next generation of semiconductor devices.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Hereinafter, the present invention will be explained in detail with reference to the accompanying drawings.

Figure 4:
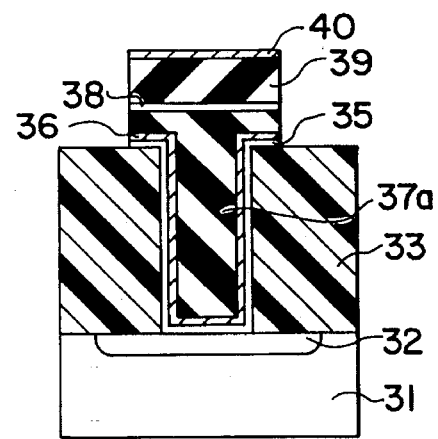
FIGS. 4 to 7 are cross-sectional views illustrating the embodiments of the wiring layer of a semiconductor device according to the present invention.

FIG. 4 is a sectional view illustrating a first embodiment of a wiring layer structure included in a semiconductor device, in accordance with the present invention.

In FIG. 4 reference numeral 31 denotes a semiconductor substrate, reference numeral 32 denotes an impurity-doped region formed in a surface portion of semiconductor substrate 31, reference numeral 33 denotes an insulating layer comprised of BPSG, reference numeral 35 denotes a diffusion barrier layer formed on the inner surface of the contact hole, on the exposed surface of the semiconductor substrate and on insulating layer 33, reference numeral 36 denotes a nucleation layer formed on diffusion barrier layer 35, reference numeral 37a denotes a CVD metal layer which fills up the contact hole and has a planarized surface, reference numeral 38 denotes an intermediate layer, reference numeral 39 denotes the reliable sputtered metal layer formed on intermediate layer 38, and reference numeral 40 denotes an anti-reflective layer.

Figure 5:
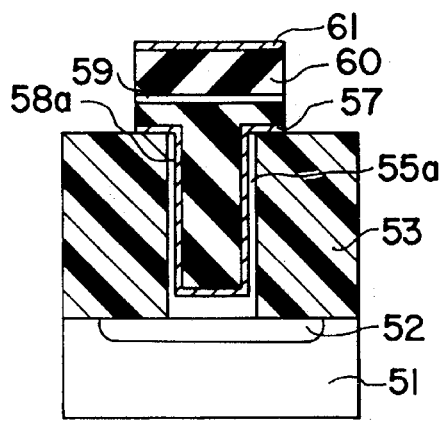

FIG. 5 is a cross-sectional view illustrating a second embodiment of a wiring layer structure for a semiconductor device, in accordance with the present invention.

In FIG. 5 reference numeral 51 denotes a semiconductor substrate, reference numeral 52 denotes an impurity-doped region formed in a surface portion of semiconductor substrate 51, reference numeral 53 denotes an insulating layer comprised of BPSG, reference numeral 55a denotes a diffusion barrier layer formed on the exposed surface of semiconductor substrate 51 and on the inner surface of the contact hole, reference numeral 57 denotes a nucleation layer formed on diffusion barrier layer 55a and on insulating layer 53, reference numeral 58a denotes a CVD metal layer which fills up the contact hole and has a planarized surface, reference numeral 59 denotes an intermediate layer, reference numeral 60 denotes a reliable sputtered metal layer formed on intermediate layer 59, and reference numeral 61 denotes an anti-reflective layer.

Figure 6:
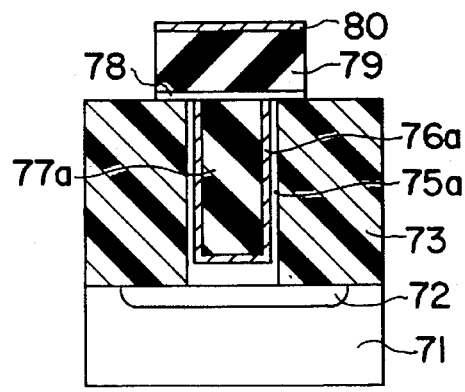

FIG. 6 is a cross-sectional view illustrating a third embodiment of a wiring layer structure for a semiconductor device in accordance with the present invention.

In FIG. 6 reference numeral 71 denotes a semiconductor substrate, reference numeral 72 denotes an impurity-doped region formed in a surface portion of semiconductor substrate 71, reference numeral 73 denotes an insulating layer comprised of BPSG, reference numeral 75a denotes a diffusion barrier layer formed on the inner surface of the contact hole and on the exposed surface of semiconductor substrate 71, reference numeral 76a denotes a nucleation layer formed on diffusion barrier layer 75a, reference numeral 77a denotes a CVD metal plug which fills up the contact hole and has a planarized surface, reference numeral 78 denotes an intermediate layer formed on CVD metal plug 77a and insulating layer 73, reference numeral 79 denotes a reliable sputtered metal layer formed on intermediate layer 78, and reference numeral 80 denotes an anti-reflective layer.

Figure 7:
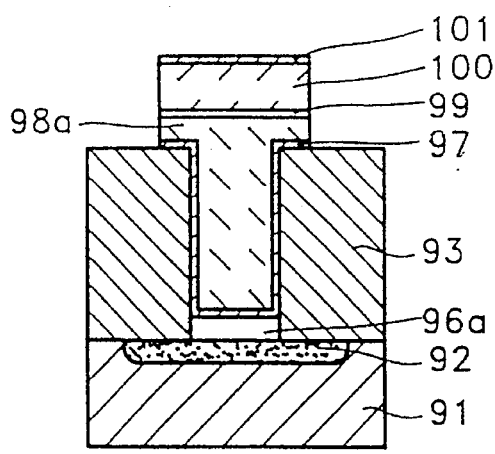

FIG. 7 is a cross-sectional view illustrating a fourth embodiment of a wiring layer structure for a semiconductor device, in accordance with the present invention.

In FIG. 7, reference numeral 91 denotes a semiconductor substrate, reference numeral 92 denotes an impurity-doped region formed in a surface portion of semiconductor substrate 91, reference numeral 93 denotes an insulating layer comprised of BPSG, reference numeral 96a denotes a diffusion barrier layer formed on the exposed surface of semiconductor substrate 91, reference numeral 97 denotes a nucleation layer formed on diffusion barrier layer 96a on the inner surface of the contact hole and on insulating layer 93, reference numeral 98a denotes a CVD metal layer which fills up the contact hole and has a planarized surface, reference numeral 99 denotes an intermediate layer, reference numeral 100 denotes a reliable sputtered metal layer formed on intermediate layer 99, and reference numeral 101 denotes an anti-reflective layer.

The wiring layers of the present invention, as shown in FIG. 4 to FIG. 7, and methods for manufacturing the same will now be explained in more detail with reference to the following embodiments.

Embodiment 1

FIGS. 8 to 12 are schematic views illustrating a first embodiment of the method for manufacturing a wiring layer structure for a semiconductor device, in accordance with the present invention.

Figure 8:
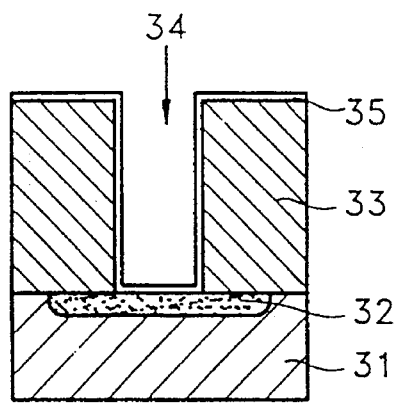
FIGS. 8 to 12 are schematic views illustrating a first embodiment of a method for forming a wiring layer of a semiconductor device according to the present invention.

FIG. 8 illustrates the step of forming diffusion barrier layer 35. More particularly, insulating layer 33 is formed on semiconductor substrate 31, wherein impurity-doped region 32 is formed in a surface portion thereof. Insulating layer 33 is formed to a thickness of approximately 0.8 µm to 1.6 µm using BPSG. Then an opening which exposes a surface portion of impurity-doped region 32 of semiconductor substrate 31 is formed in insulating layer 33 as contact hole 34. The size of contact hole 34 is 0.2 µm to 0.6 µm, and the aspect ratio thereof is 2 to 6.

Then diffusion barrier layer 35 is formed on the upper surfaces of insulating layer 33, on the inner surfaces of contact hole 34, and on the exposed surface portion of semiconductor substrate 31 wherein an impurity-doped region 32 is formed.

Diffusion barrier layer 35 is formed as follows. Initially, a first diffusion barrier layer is formed by depositing titanium to a thickness of approximately 200 Å–500 Å using a DC magnetron sputtering method under an argon atmosphere. Then, a second diffusion barrier layer is formed by depositing titanium nitride to a thickness of 300 Å to 1,500 Å using a sputtering method under an argon atmosphere having a pressure of 7 mTorr and an $N_2$ relative partial pressure of 40%, thereby forming diffusion barrier layer 35 comprised of the first and second diffusion barrier layers. The substrate temperature is maintained at 200° C. during the depositing of both Ti and TiN.

Then, diffusion barrier layer 35 is annealed at a temperature of 450° C. to 500° C. for 30–60 minutes under an $N_2$ atmosphere. At this time, a small amount of oxygen is mixed in, to thereby form an oxide layer (not shown), comprised of oxides such as $TiO_2$, $TiO$ or $Ti_2O$, on the surface of diffusion barrier layer 35. This oxide layer deteriorates the wettability between the diffusion barrier layer and Al grains, which lowers the Al grain nucleation in the subsequent Al deposition processing via a CVD method.

Figure 9:
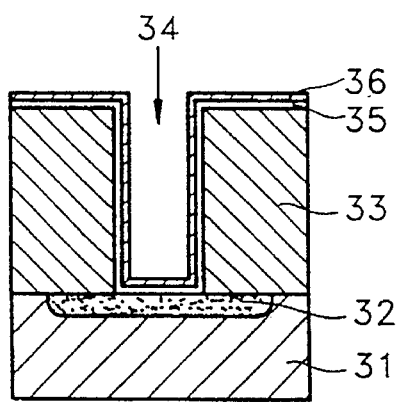

FIG. 9 illustrates the step of forming nucleation layer 36 on diffusion barrier layer 35. A refractory metal such as Ti, Mo, Ta or Zr or a refractory metal compound thereof, and preferably Ti, is deposited on diffusion barrier layer 35 thereby forming nucleation layer 36. Nucleation layer 36 may be formed by exposing diffusion barrier layer 35 to a $TiCl_4$ atmosphere, which is undesirable since the remaining chlorine may cause a corrosion problem. At this time, the thickness of nucleation layer 36 is approximately 100 Å. It is desirable to perform the deposition at a slow rate, and preferably at a rate of approximately 10 Å/second.

According to another embodiment of the present invention, nucleation layer 36 can be a hydrogen-treated layer formed by hydrogen-terminating the surface of diffusion barrier layer 35 having the oxide layer formed thereon or by reducing the surface portion of diffusion barrier layer 35. The hydrogen termination or the reduction of diffusion barrier layer 35 is performed at a hydrogen pressure of 2.5 mTorr, a microwave power of 1 kW, a bias voltage of 0 V and a substrate temperature of 25° C. for ten seconds to one minute, using electron cyclotron resonance (ECR) equipment which generates a hydrogen plasma. (The present inventor has an invention concerning a method for improving the reflow characteristic of the deposited Al when the heat treatment is performed wherein the hydrogen-treating is performed before the Al deposition, thereby largely forming the grain of the deposited Al layer by a sputtering method, and filed with the USPTO as U.S. patent application Ser. No. 08/115,733.)

According to another embodiment of the present invention, nucleation layer 36 may be a silicon layer formed by successively depositing silicon via a sputtering method using a silicon as a target, or via flushing silicon hydride, for example, SiH$_4$, in a vacuum so as to avoid forming an oxide film. Copper may be used as a target instead of silicon, thereby forming a copper layer as nucleation layer 36. Additionally, a composite layer comprised of copper and silicon layers may be formed as nucleation layer 36.

Nucleation layer 36 without an oxide on its surface is desirable. To this end, nucleation layer 36 has to be successively formed in a vacuum, and it is most preferable to perform a hydrogen treatment to thereby hydrogen-terminate the surface of nucleation layer 36 after its formation.

According to another embodiment of the present invention, a silylation layer as nucleation layer 36 is formed by performing a silylation on the surface portion of diffusion barrier layer 36. Here, the silylation is performed by exposing diffusion barrier layer 36 to SiH$_4$, Si$_2$H$_6$, plasma, or a Si* or SiH* radical using a silicon hydride. At this time, the partial pressure of silicon hydride is 0.5 to 15 mTorr, the electrical power is 1 to 10 kW, and the temperature of the substrate ranges from room temperature to 200° C. In addition to this, the vacuum is maintained at 5×10$^8$ Torr or below during the formation of the silylation layer. Silicon hydride generates reactive radicals such as Si*, H*, SiH* or SiH$_2$* during the glow discharge or in the course of sputtering. Hydrogen prevents a semiconductor substrate from being damaged during the sputtering process by the emission of the second electron, to thereby improve the characteristic or reliability of the resulting semiconductor elements. Accordingly, it is preferable to add hydrogen having a partial pressure of 0 to 5 mTorr during the silylation process. Thus, nucleation layer 36 may be obtained by forming a silylation layer as above, and the silylation layer can prevent junction spiking by blocking the diffusion paths of Al and silicon.

Figure 10:
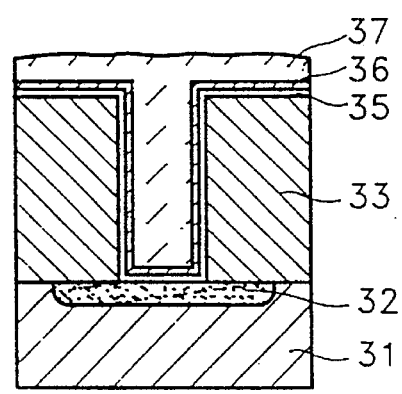

FIG. 10 illustrates the step of forming a CVD metal layer 37. After forming nucleation layer 36, substrate 31 is transferred to another reactive chamber without breaking the vacuum. Then, Al is deposited on nucleation layer 36 by a CVD method, to thereby form CVD metal layer 37 which fills up contact hole 34. In the present embodiment, Al deposition may be performed by a conventional CVD method. For example, Al deposition may be performed using organometallic compounds such as TIBA, TMA or DMAH as a source.

When Al is deposited using TIBA, a cold wall type apparatus is used. When TIBA is introduced, the vapor temperature thereof is maintained at 90° C. or below, and preferably at 84° C. to 86° C., and an inert gas, for example, argon, is used as a carrier gas via bubbling. At this time, the flow rate of the argon gas is preferably approximately 7 liters/minute. The deposition temperature is approximately 250° C. when TIBA is thermally decomposed. However, the deposition rate is high, which is undesirable. Since the deposition rate decreases when the temperature is lowered, the deposition may be performed at a lower temperature so as to reduce the deposition rate. Under the conditions described above, when the deposition rate is approximately 1,000 Å/minute and the size of the contact hole is 0.2 μm, the contact hole can be filled up by depositing Al for about one minute using TIBA.

According to another embodiment of the present invention, CVD metal layer 37 is formed by depositing Al using Al hydride, for example, DMDH. At this time, the Al hydride is kept at a low temperature so as to prevent its thermal decomposition, and the deposition is performed at a temperature of 50° C. or above. The vapor status of the source can be controlled using an inert gas such as argon. In order to reduce the deposition rate, the substrate temperature is lowered or the amount of the source is decreased. In a deposition method using Al hydride, the deposition temperature may be lower when using a suitable source. Deposition is performed in the reactive chamber having a pressure of 0.01 to 10 Torr at a temperature of 50° C. to 150° C.

For example, in a vapor phase of (Me$_3$N)$_2$AlH$_3$, the partial pressure of (Me$_3$N)AlH$_3$ is known as predominant at a temperature of 80° C. This phenomenon is caused since Me$_3$N decomposition from (Me$_3$N)$_2$AlH$_3$ occurs prior to a hydrogen loss. This phenomenon occurs identically for the case of DMAH. When (Me$_3$N)$_2$AlH$_3$ is used as a source or a precursor, Al is deposited at a temperature of 80° C. or above. Accordingly, Al hydride is used when Al is deposited at a low temperature ranging from 80° C. to 150° C. At this time, the pressure is maintained at a pressure of 10 mTorr to 10 Torr. The deposition rate ranges from 0.6 to 1.0 μm/minute when the deposition temperature of Al is 180° C. To decrease the deposition rate, the temperature is lowered and the contact hole is filled up by thermally decomposing (Me$_3$N)$_2$AlH$_3$ at a temperature of 150° C. At this time, the deposition may be performed by applying plasma so as to perform a thermal decomposition more effectively.

Figure 1:
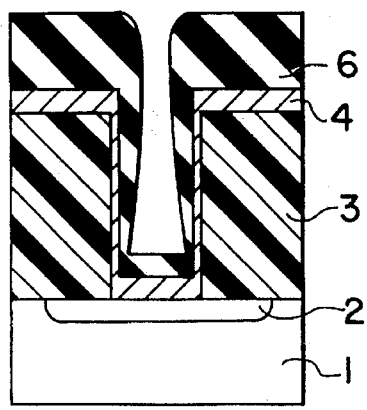
FIG. 1 illustrates the deposited profile of Al formed when a conventional sputtering is performed.
Figure 2:
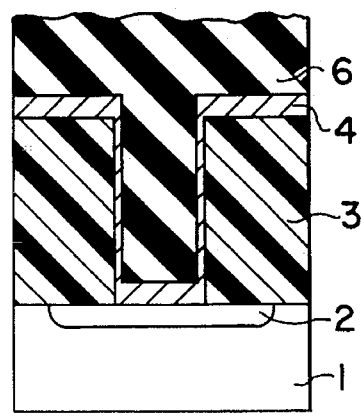
FIG. 2 illustrates the profile of Al layer obtained by depositing Al according to the conventional CVD method.
Figure 3:
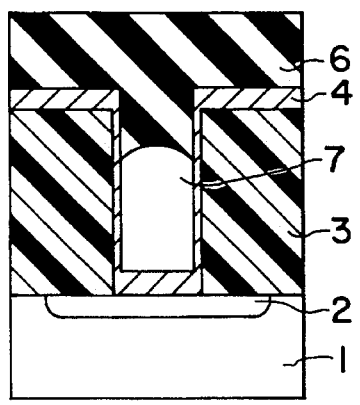
FIG. 3 illustrates a void which exists in the contact hole when Al metal is deposited and is heat-treated in a vacuum or when the contact hole is filled up by a high temperature sputtering method.

The surface of CVD metal layer 37 thus obtained is not planarized as shown in FIG. 3. Accordingly, precision cannot be enhanced in the alignment step when the subsequent photolithography process is performed. Further, CVD metal layer 37 contains a residual impurity, for example, carbon. Therefore, the resistance against the electro-migration and stress-migration is low and the reliability thereof is low.

Figure 11:
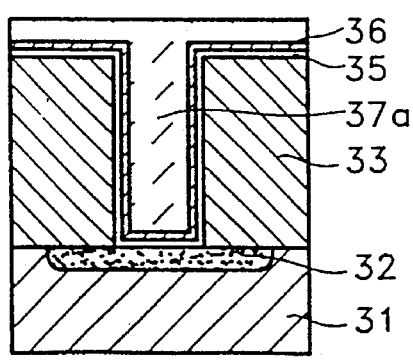

FIG. 11 illustrates the step of planarizing CVD metal layer 37. After forming CVD metal layer 37, semiconductor substrate 31 is moved into another chamber without breaking the vacuum. Then, CVD metal layer 37 is heat-treated at a high temperature below its melting point, and more desirably at a metal temperature of 0.6 Tm to Tm (where Tm is the melting point of the metal which constitutes CVD metal layer 37), and particularly, at 460° C. (here, the temperature of the equipment for the heat-treatment is about 500° to 550° C.) for 1–5 minutes, and more preferably for two minutes, thereby planarizing the surface of CVD metal layer 37. Metal atoms which constitute CVD metal layer 37 exhibit reflow characteristics as a result of heat-treatment, due to stress relaxation of the metal layer and the migration of the metal atoms. The migration of metal atoms decreases the free energy thereof, which decreases the surface area of the metal layer. As a result, the surface of CVD metal layer 37 reaches a high degree of planarization. Additionally, the reliability of CVD metal layer 37 is improved since the impurity included in the metal layer is removed (this is called a baking effect) during migration of the metal atoms. It is preferable to perform the heat-treatment under an inert gas (for example, $N_2$ or Ar) atmosphere or a reductive gas (for example $H_2$) atmosphere so as to avoid oxidizing the surface of CVD metal layer 37. Other heat-treatments such as rapid thermal annealing (RTA) or ramp heating methods can be used instead of the argon conduction method. These heat-treatment methods can be used alone or in combination with other methods. Reference numeral 37a of FIG. 11 denotes a CVD metal layer having a planarized surface.

Figure 12:
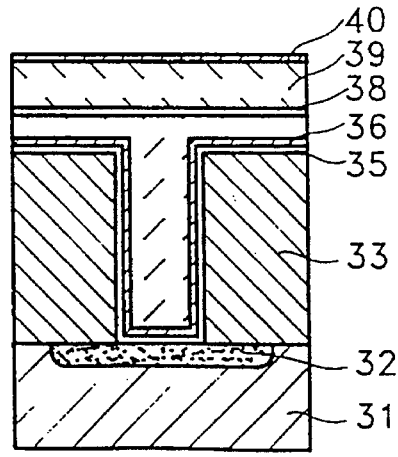

FIG. 12 illustrates the step of forming intermediate layer 38 and sputtered metal layer 39. As intermediate layer 38, a diffusion barrier layer is formed by depositing Ti or TiN to a thickness of 200 Å using a sputtering method on CVD metal layer 37a. At this time, the deposition temperature is 200° C. Then, sputtered metal layer 39 is formed by depositing Al or an Al alloy to a thickness of 2,000 Å to 4,000 Å, and preferably to 3,000 Å, via a sputtering method on intermediate layer 38. Sputtered metal layer 39 is formed at a pressure of $5\times10^7$ Torr or below, and preferably $5\times10^8$ Torr or below, and at a plasma pressure of 2 mTorr or below.

Sputtered metal layer 39 is formed by a sputtering method at a temperature of 350° C. or below using Al-1%Si-0.5%Cu as a target. Further, in order to improve the reliability of the wiring layer, the sputtered metal layer may be formed by sputtering at a temperature of 150° C. or below using Al-1%Si-0.5%Cu as a target thereby forming a first metal layer having a thickness of 500 Å to 1,500 Å, and preferably 1,000 Å, heat-treating the first metal layer at a high temperature below the melting point of the Al alloy, and preferably at an equipment temperature of 0.8 Tm to Tm without breaking the vacuum in the same manner as used for heat-treating CVD metal layer 37, and then successively sputtering at a temperature of 350° C. or below, and preferably at a room temperature, to thereby form a second metal layer having a thickness of 1,500 Å to 2,500 Å, and preferably 2,000 Å. At this time, the second metal layer is preferably formed using Al-0.5% Cu which does not contain a Si component, as a target, thereby giving a composite layer as sputtered metal layer 39 comprised of first and second metal layers which respectively have different compositions. Forming the composite layer can prevent the formation of a Si precipitation.

According to another embodiment of the present invention, to prevent the Si precipitation formation a single layer as sputtered metal layer 39 may be formed using Al-0.5% or less Si-0.5%Cu as a target. Further, sputtered metal layer 39 may be formed by sputtering at a temperature of 150° C. or below using Al-0.5% or less Si-0.5%Cu as a target to form a first metal layer, heat-treating the first metal layer without breaking the vacuum at a high temperature below the melting point of the Al alloy, and then additionally sputtering at a temperature of 350° C. or below. At this time, the amount of silicon contained in the above Al alloy is controlled such that Si precipitation is not generated after the subsequent patterning process. In this case, the amount of silicon contained in sputtered metal layer 39 is preferably about 0.4%.

According to another embodiment of the present invention, a diffusion barrier layer as intermediate layer 38 may be formed using a refractory metal silicides such as $TiSi_2$, $TaSi_2$, $MoSi_2$ or $WSi_2$. In this case, sputtered metal layer 39 is formed by using an Al alloy which does not contain a Si component, for example, pure Al, an Al—Cu alloy (Al-0.5%Cu alloy) or Al—Ti alloy, as a target.

According to another embodiment of the present invention, a silicon layer, i.e., a sacrificial layer, instead of a diffusion barrier layer may be formed as intermediate layer 38. The silicon layer is formed to a thickness of 20 Å using $SiH_4$ or $Si_2H_6$, by a CVD method. Then, sputtered metal layer 39 is formed using an Al alloy having no Si component, for example, pure Al, an Al—Cu alloy (Al-0.5%Cu alloy) or Al—Ti alloy as a target.

When sputtered metal layer 39 is formed by depositing a metal at a low temperature of 150° C. or below, the metal is deposited using a sputtering method at a pressure of 4 mTorr or below, preferably 2 mTorr of Ar atmosphere, and at the deposition rate of 100 Å/second to 150 Å/second, preferably 120 Å/second. Here, the power is 5 kW to 7.2 kW.

Then, to improve the efficiency of the subsequent photolithography process, anti-reflective layer 40 is formed by depositing titanium nitride to a thickness of 200 Å to 500 Å on the surface of sputtered metal layer 39 using a sputtering method. After anti-reflective layer 40 is formed, a predetermined resist pattern (not shown) is formed on anti-reflective layer 40 by a conventional photolithography process for forming a wiring pattern of a semiconductor device. Anti-reflective layer 40, sputtered metal layer 39, intermediate layer 38, CVD metal layer 37, nucleation layer 36 and diffusion barrier layer 35 are sequentially etched by using the above resist pattern as an etching mask to thereby complete the wiring layer structure according to the present invention, as shown in FIG. 4.

Embodiment 2

FIGS. 13 to 18 are schematic views for illustrating a second embodiment of a method for forming a wiring layer structure for a semiconductor device according to the present invention.

In this second embodiment, the deposition method and the heat-treatment concept are the same as those of Embodiment 1, but the process for forming the diffusion barrier layer in the contact hole is different.

Figure 13:
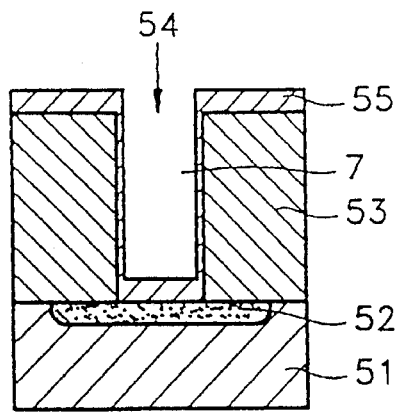
FIGS. 13 to 18 are schematic views illustrating a second embodiment of a method for forming a wiring layer of a semiconductor device according to the present invention.

FIG. 13 illustrates the step of forming diffusion barrier layer 55. More particularly, insulating layer 53 is formed on semiconductor substrate 51 where an impurity-doped region 52 is formed in the same manner as in Embodiment 1. Then, an opening which exposes a portion of the surface of impurity-doped region 52 of semiconductor substrate 51 is formed in insulating layer 53 as contact hole 54. The size of contact hole 54 is 0.2 μm to 0.6 μm, and the aspect ratio thereof is 2 to 6. Then, a diffusion barrier layer 55 is formed on the upper surfaces of insulating layer 53, on the inner surface of contact hole 54, and on the exposed surface portion of semiconductor substrate 51.

Generally, a diffusion barrier layer is formed by a sputtering method. When the diffusion barrier layer is formed by a conventional sputtering method, the step coverage at the contact hole of the diffusion barrier layer becomes poor due to the high aspect ratio, which causes a failure at the contact hole. With the advent of high-integration in semiconductor devices, this phenomenon has become very serious, especially for a contact hole which has a high aspect ratio and size is below one half micron. In the present invention, to improve the step coverage of the diffusion barrier layer at the contact hole having a high aspect ratio, a refractory metal such as Ti or a refractory metal compound such as TiN is sputtered so as to have a vertical incident angle against the semiconductor substrate. For sputtering metal so as to have a vertical incident angle, the sputtering is performed at a pressure far lower than a conventional sputtering method, for example, at a pressure of 0.5 mTorr or below, or by using a collimator which selectively deposits only the metal having a vertical incident angle. Thus, the step coverage of the bottom surface of contact hole 54 can be improved.

When a collimator is used in the sputtering process, a honeycomb-shaped collimator comprised of Ti having a diameter of ⅜ of an inch to two inches is provided to the sputtering chamber, and then sputtering is performed at a pressure of 2 mTorr or below.

In the present embodiment, Ti is deposited by using the above collimator. More particularly, when the size of contact hole 54 is 0.3 μm, Ti is deposited to a thickness of 500 Å to 1,000 Å on insulating layer 53 using a collimator having an aspect ratio of 1.0 or above and a diameter of ⅜ of an inch, so as to have a thickness of 200 Å to 500 Å on the lower part of contact hole 54. Then, under a nitrification atmosphere, for example an $NH_3$ atmosphere, the Ti layer is heat-treated at a temperature of approximately 800° C. for 30 seconds, using an RTA apparatus. As a result, a $TiSi_2$ layer is formed in the lower portion of the Ti layer and a TiN layer is formed in the upper portion of the Ti layer, thereby giving diffusion barrier layer 55.

Then, a refractory metal compound such as TiN may be additionally deposited to a thickness of 200 Å to 500 Å on diffusion barrier layer 55.

Figure 14:
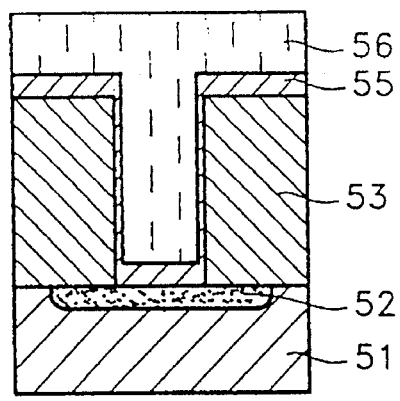

FIG. 14 illustrates the step of forming photoresist layer 56. A photoresist is coated to a thickness of 1.0 μm to 1.4 μm on the whole surface of the resultant structure having diffusion barrier layer 56 formed thereon, to thereby form photoresist layer 56.

Figure 15:
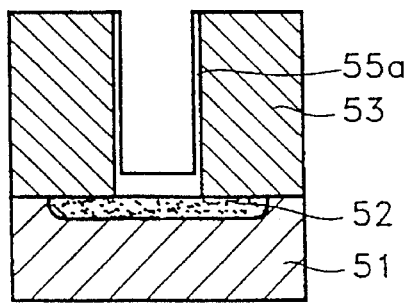

FIG. 15 illustrates the step of leaving diffusion barrier layer 55 only in the region of contact hole 54 using the above described photoresist layer 56. Using photoresist layer 56 as obtained above, an etch-back or polishing process is performed on the whole surface of the resultant structure, thereby leaving the photoresist only in the contact hole. Then, using the photoresist which remains in the region of contact hole 54, diffusion barrier layer 55 minus the portions formed on the inner surface of contact hole 54 and on the exposed surface portion of semiconductor substrate 51, that is, diffusion barrier layer 55 formed on insulating layer 53, is removed, to thereby leave diffusion barrier layer 55 only in the region of contact hole 54. In FIG. 15, reference numeral 55a denotes a diffusion barrier layer which remains only in the contact hole region. Then, the photoresist remaining in contact hole 54 is removed.

Figure 16:
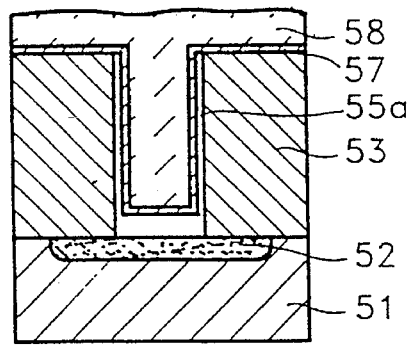

FIG. 16 illustrates the step of forming nucleation layer 57 and CVD metal layer 58. After the photoresist remaining in contact hole 54 is removed, nucleation layer 57 is formed on insulating layer 53 and on diffusion barrier layer 55a which exists in contact hole 55, in the same manner as in Embodiment 1. Here, the method for forming nucleation layer 57 is the same as that in Embodiment 1, but the hydrogen treating method for forming nucleation layer 57 is excluded in the present embodiment.

Then, a metal is deposited via a CVD method on nucleation layer 57 in the same manner as in Embodiment 1, to thereby form CVD metal layer filling up contact hole 54.

Figure 17:
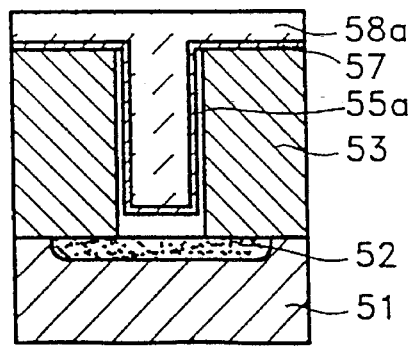

FIG. 17 illustrates the step of planarizing CVD metal layer 58. After CVD metal layer 58 is formed, semiconductor substrate 51 is moved into another chamber without breaking the vacuum and is heat-treated at a high temperature below its melting point, and more desirably at a temperature of 0.6 Tm to Tm for 1–5 minutes, and preferably for about two minutes, using the argon conduction method in the same manner as in Embodiment 1, thereby planarizing the surface of CVD metal layer 58. In FIG. 17, reference numeral 58a denotes the CVD metal layer whose surface is planarized.

Figure 18:
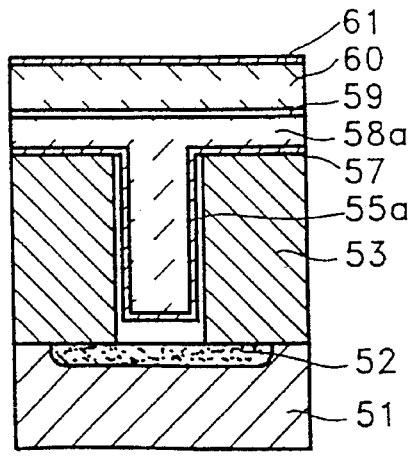

FIG. 18 illustrates the step of forming intermediate layer 59 and sputtered metal layer 60. Intermediate layer 59 and sputtered metal layer 60, having excellent electro-migration and stress-migration tolerances, are formed on CVD metal layer 58a, having a planarized surface, in the same manner as in Embodiment 1. Of course, sputtered metal layer 60 whose reliability is excellent can be formed without forming an intermediate layer. The preferable thickness of the above sputtered metal layer is 3,000 Å.

Additionally, in the same manner as in Embodiment 1, to improve the reliability of the formed wiring layer, a first metal layer having a thickness of 1,000 Å is formed using an Al alloy at a temperature of 150° C. or below, which then is heat-treated at a temperature of 0.6 Tm to Tm without breaking the vacuum. The (111) orientation of the thus-obtained metal layer is increased, which also increases the reliability thereof. When a metal such as Al is sputtered, the electro-migration resistance increases as the X-ray diffraction intensity of the (200) plane divided by that of the (100) plane, that is, the ratio of I(111) to I(200), increases. Accordingly, when the (111) orientation of the lower sputtered metal layer is increased by the above mentioned heat-treatment, the reliability of the metal wiring of a semiconductor device is improved, too.

Additionally, intermediate layer 59 may be formed by selectively depositing TiN whose preferred orientation is (111). When Al is deposited after depositing a material whose preferred orientation is (111) such as TiN, on planarized CVD metal layer 58a, a metal layer whose preferred orientation (111) is enhanced can be obtained. Then, in the same manner as in Embodiment 1, a second metal is successively deposited via a sputtering to a thickness of 2,000 Å, to thereby obtain sputtered metal layer 39.

Then, to improve the subsequent photolithography process, titanium nitride is deposited to a thickness of 200 Å to 500 Å on sputtered metal layer 60 in the same manner as in Embodiment 1, to thereby form an anti-reflective layer 61. Then, for the wiring pattern of the semiconductor device, a predetermined resist pattern (not shown) is formed on anti-reflective layer 61 through a conventional photolithography process. Then, anti-reflective layer 61, sputtered metal layer 60, intermediate layer 59, planarized CVD metal layer 58a and nucleation layer 57 are sequentially etched using the resist pattern as an etching mask, thereby completing the wiring layer of the present invention illustrated in FIG. 5.

Embodiment 3

FIGS. 19 to 24 are schematic views for illustrating a third embodiment of a method of forming a wiring layer for a semiconductor device, according to the present invention.

The deposition method and heat-treatment concept of the present embodiment are similar to those of Embodiment 1. However, the processes for forming a diffusion barrier layer and a nucleation layer in the contact hole are different from those of Embodiment 1.

Figure 19:
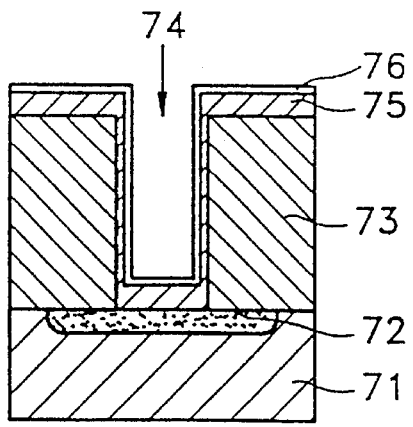
FIGS. 19 to 24 are schematic views illustrating a third embodiment of a method for forming a wiring layer of a semiconductor device according to the present invention.

FIG. 19 illustrates the step of forming diffusion barrier layer 75 and a nucleation layer 76. More particularly, in the same manner as Embodiments 1 and 2, insulating layer 73 is formed on semiconductor substrate 71 wherein impurity-doped region 72 is formed. Then, an opening which exposes a portion of the surface of impurity-doped region 72 of semiconductor substrate 72 is formed in insulating layer 73. Here, the opening is a contact hole 74 which exposes a portion of impurity-doped region 72 of semiconductor substrate 71, as in Embodiments 1 and 2.

Figure 20:
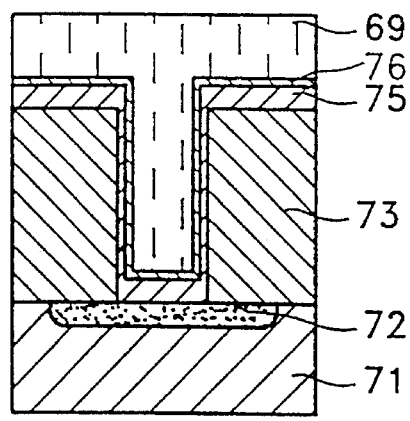

FIG. 20 illustrates a step of forming photoresist layer 69. A photoresist is coated to a thickness of 1.0 μm to 1.4 μm on the whole surface of the resultant structure including diffusion barrier layer 75 and nucleation layer 76 to thereby form photoresist layer 69.

Figure 21:
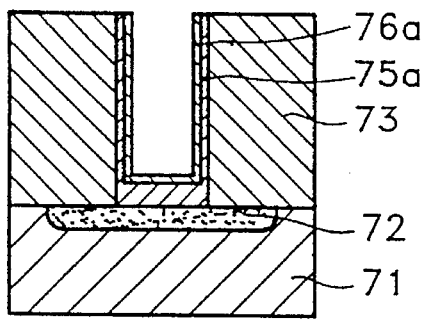

FIG. 21 illustrates the step of leaving the diffusion barrier layer and the nucleation layer only in the region of contact hole using the above described photoresist layer. In the same manner as in Embodiment 2, an etch-back or polishing process is performed on the whole surface of the resultant structure using photoresist layer 69 as obtained above, to leave photoresist only in the region of contact hole 74. Then, diffusion barrier layer 75 and nucleation layer 76 excluding the portions formed on the inner surface of contact hole 74 and on the exposed surface portion of semiconductor substrate 71, that is, the portions of nucleation layer 76 and diffusion barrier layer 76 formed on insulating layer 73, are removed using the photoresist which remains in contact hole 74, to thereby leave diffusion barrier layer 75 and nucleation layer 76 only in the region of contact hole 74. In FIG. 21, reference numerals 75a and 76a denote a nucleation layer and a diffusion barrier layer which exist only in the contact hole region. Then, the photoresist remaining in the region of contact hole 74 is removed.

According to another embodiment of the present invention, the process of leaving the photoresist only in the region of contact hole 74 may be performed by an exposure and development process using a photo mask having a pattern for forming contact hole 74 formed thereon.

When the etch-back process is performed, the nucleation effect is removed due to the presence of an oxide on the surface of nucleation layer 76. Accordingly, in order to form nucleation layer 76 only on the contact hole, the resultant structure obtained after the etch-back process is exposed to a hydrogen radical or to a hydrogen plasma using a $H_2$ ECR plasma apparatus, to form a hydrogen-termination layer on the whole surface of the resultant structure. The hydrogen-termination layer can act as the nucleation layer of the present invention. Then, the resultant structure is kept in the vacuum apparatus for a predetermined time at a temperature of 400° C. or above, which removes the hydrogen termination effect of insulating layer 73. As a result, nucleation layer 76a which exists only in the region of contact hole 74 is obtained.

Figure 22:
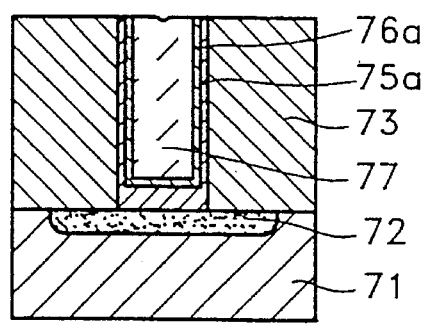

FIG. 22 illustrates the step of forming a CVD metal plug 77. After completing the steps shown in FIG. 21, contact hole 74 is filled up by depositing Al or Al alloy using a CVD method, as in Embodiments 1 and 2. The CVD metal layer may be formed on the insulating layer in Embodiments 1 and 2, since the nucleation layer exists on the insulating layer. However, in the present embodiment, Al or an Al alloy is deposited only in the contact hole since nucleation layer 76a exists only in the region of the contact hole, to thereby obtain CVD metal plug 77 as shown in FIG. 22.

The surface of CVD metal plug 77 thus-obtained is not even, as in the case of the CVD metal layer before the heat-treatment in Embodiment 1 or 2. Moreover, recessed areas or protrusions may be formed in the region of contact hole 74.

Figure 23:
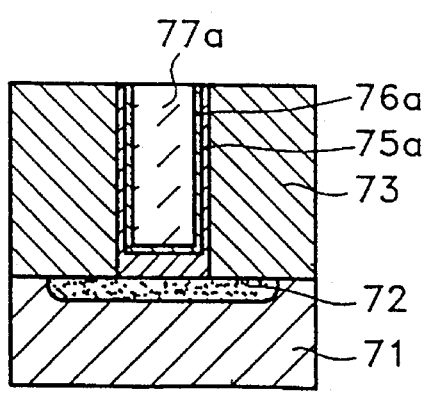

FIG. 23 illustrates the step of planarizing the surface of CVD metal plug 77. In the same manner as in Embodiment 1, after forming CVD metal plug 77, semiconductor substrate 71 is moved into another chamber without breaking the vacuum, and is heat-treated at a high temperature below the melting point, and more desirably at a temperature of 0.6 Tm to Tm, for 1–5 minutes, and more preferably for about two minutes, using an argon conduction method, thereby planarizing the surface of CVD metal plug 77. In FIG. 23, reference numeral 77a denotes a CVD metal plug having a planarized surface.

Figure 24:
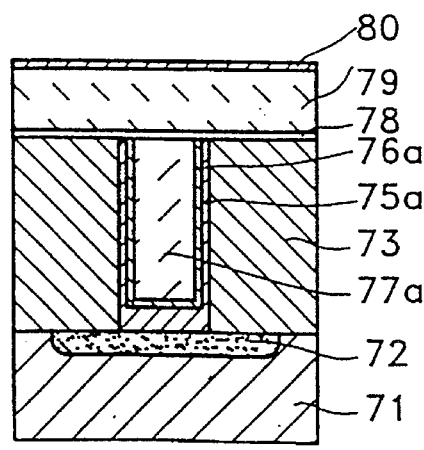

FIG. 24 illustrates the step of forming intermediate layer 78 and sputtered metal layer 79. Intermediate layer 78 and sputtered metal layer 79 having excellent electro-migration and stress-migration resistances are formed on CVD metal plug 77a having a planarized surface and insulating layer 73.

More particularly, in order to enhance the life span of the metal wiring of Al or Al alloy and/or to unify the underlayers of the sputtered metal layer, a transition metal such as Ti and/or a transition metal compound such as TiN is deposited to a thickness of 200 Å to 1,000 Å. The deposition method is the same as those of Embodiments 1 and 2.

Then, sputtered metal layer 79 is formed by depositing Al or Al alloy having a thickness of 3,000 Å to 5,000 Å, and preferably 4,000 Å on intermediate layer 78. Sputtered metal layer 79 is formed under the same conditions as described in Embodiment 1.

Sputtered metal layer 79 is formed by sputtering at a temperature of 350° C. or below using Al-1%Si-0.5% as a target. To further improve the reliability of the wiring layer, after forming a first metal layer having a thickness of 1,000 Å to 2,000 Å by a sputtering method at a temperature of 150° C. or below, using Al-1%Si-0.5%Cu as a target, the first metal layer is heat-treated at a high temperature below the melting point of the above Al alloy, and preferably, at a temperature of 0.6 Tm to Tm, without breaking the vacuum. Then, an additional sputtering is performed at a temperature of 350° C. or below, and preferably, at room temperature, to thereby form a second metal layer having a thickness of 2,000 Å to 3,000 Å, which gives sputtered metal layer 79. At this time, the second metal layer may be formed by using Al-0.5%Cu without containing a Si component, as a target as in Embodiment 1, thereby forming a composite layer consisting of first and second layers which have mutually different compositions, as sputtered metal layer 79.

Otherwise, sputtered metal layer 79 may be formed as a single layer using Al-0.5% or less Si-0.5%Cu as a target.

Then, in order to improve the subsequent photolithography process, titanium nitride is deposited to a thickness of 200 Å to 500 Å on the surface of sputtered metal layer 79 in the same manner as in Embodiment 1, to thereby form an anti-reflective layer 80. Then, for forming the wiring pattern of the semiconductor device, a predetermined resist pattern (not shown) is formed on anti-reflective layer 80 through a conventional photolithography process. Then, anti-reflective layer 80, sputtered metal layer 79, and intermediate layer 78 are sequentially etched using the resist pattern as an etching mask, thereby completing the wiring layer of the present invention as shown in FIG. 6.

Embodiment 4

FIGS. 25 to 30 are schematic views for illustrating a fourth embodiment of a method of forming a wiring layer for a semiconductor device according to the present invention.

Figure 25:
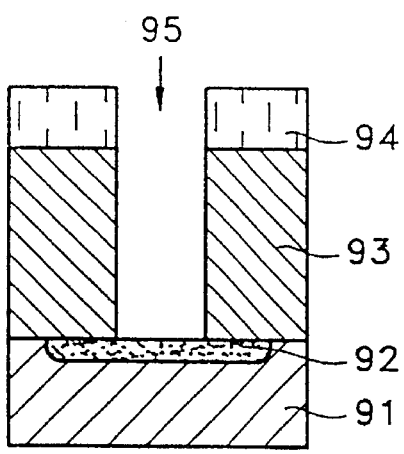
FIGS. 25 to 30 are schematic views illustrating a fourth embodiment of a method for forming a wiring layer of a semiconductor device according to the present invention.

FIG. 25 illustrates the step of forming a contact hole 95. More particularly, insulating layer 93 is formed on semiconductor substrate 91 wherein impurity-doped region 92 is formed, in the same manner as in Embodiment 1. Then, resist pattern 94 is formed by a photolithography process in order to form an opening which exposes a surface portion of impurity-doped region 92 of semiconductor substrate 91 on insulating layer 93. Using resist pattern 94 as an etching mask, insulating layer 93 is etching to thereby form an opening. Here, the opening is contact hole 95 which exposes a surface portion of impurity-doped region 92 of semiconductor substrate 91, as in Embodiment 1. The size of contact hole 95 thus obtained is 0.2 μm to 0.6 μm, and the aspect ratio thereof is 2 to 6.

Figure 26:
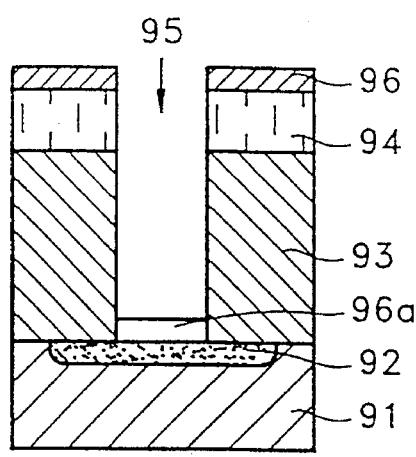

FIG. 26 illustrates the step of forming diffusion barrier layers 96 and 96a. Without removing photoresist pattern 94, diffusion barrier layers 96 and 96a are formed on the whole surface of photoresist pattern 94 and on the exposed surface of semiconductor substrate 91. In order to improve the step coverage of the diffusion barrier layer at the contact hole having a high aspect ratio, a refractory metal such as Ti or a refractory metal compound such as TiN, is deposited via a sputtering method so as to have a vertical incident angle against the semiconductor substrate, in the same manner as in Embodiment 2. Here, the reference numeral 96a denotes a diffusion barrier layer formed on the exposed surface of semiconductor substrate 91.

Figure 27:
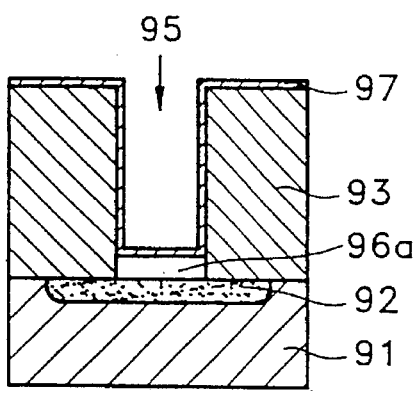

FIG. 27 illustrates the step of forming a nucleation layer 97. After removing photoresist pattern 94 and diffusion barrier layer 96 formed on photoresist pattern 94, nucleation layer 97 is formed on insulating layer 93, on the inner surface of contact hole 95, and on diffusion barrier layer 96a formed on the bottom surface of contact hole 95, i.e., the surface of the exposed semiconductor substrate 91.

Nucleation layer 97 can be obtained by depositing TiN to a thickness of 100 Å to 500 Å, at a temperature of 200° C. and at a pressure of 2 mTorr, or by depositing Ti and then heat-treating the deposited Ti at a temperature of about 800° C. for 30 seconds, under a nitrification atmosphere such as an $NH_3$ atmosphere, using an RTA apparatus.

Figure 28:
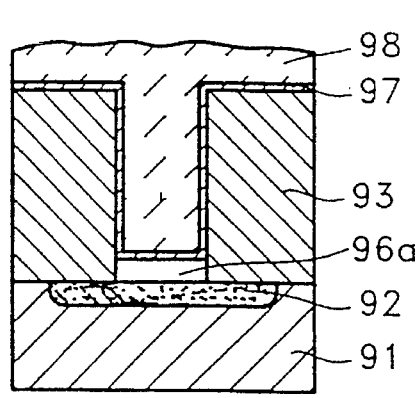

FIG. 28 illustrates the step of forming CVD metal layer 98.

After the steps shown in FIG. 27, CVD metal layer 98 is formed on nucleation layer 97 in the same manner as in Embodiment 1, to thereby fill up contact hole 95.

Figure 29:
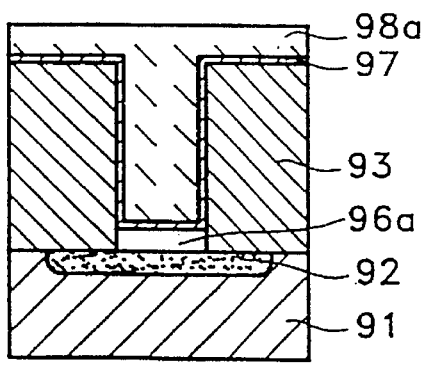

FIG. 29 illustrates the step of planarizing CVD metal layer 98. After CVD metal layer 98 is formed, in the same manner as in Embodiment 1, semiconductor substrate 92 is moved into another chamber without breaking the vacuum, and then is heat-treated at a high temperature below the melting point, and preferably at a temperature of 0.6 Tm to Tm, for 105 minutes, and preferably for about two minutes, using an argon conduction method, thereby planarizing the surface of CVD metal layer 98. In FIG. 29, reference numeral 98a denotes the CVD metal layer having a planarized surface.

Figure 30:
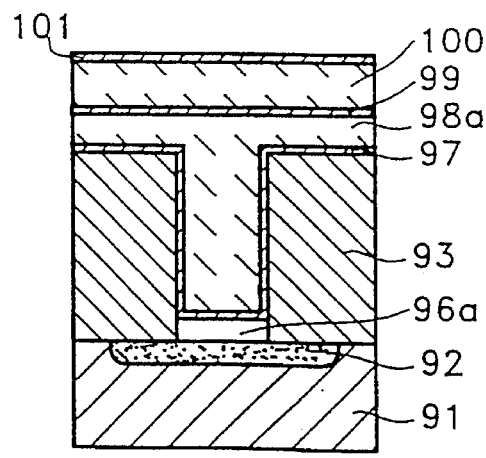

FIG. 30 illustrates the step of forming intermediate layer 99 and sputtered metal layer 100. Intermediate layer 99 and sputtered metal layer 100 having excellent electro-migration and stress-migration resistance are formed on CVD metal layer 98a having a planarized surface, in the same manner as in Embodiment 1.

Thereafter, in order to improve the subsequent photolithography process, titanium nitride is deposited to a thickness of 200 Å to 500 Å on the surface of sputtered metal layer 100 in the same manner as in Embodiment 1, to thereby form anti-reflective layer 101. Then, for forming the wiring pattern of a semiconductor device, a predetermined resist pattern (not shown) is formed on anti-reflective layer 101 through a conventional photolithography process. Then, anti-reflective layer 101, sputtered metal layer 100, intermediate layer 99, the planarized CVD metal layer 98a and nucleation layer 97 are sequentially etched using the resist pattern as an etching mask, thereby completing the wiring layer of the present invention as shown in FIG. 7.

The wiring layer of the semiconductor device of the present invention can fill a 0.3 μm-sized contact hole, and can be used as a metal wiring for high integration semiconductor devices of the next generation. Further, the contact hole is filled by a CVD method and is heat-treated, whereby the reliability thereof is improved and the surface of a CVD-Al wiring layer is planarized, to thereby easily perform the subsequent lithography process. Additionally, a metal layer having good reliability is formed on the CVD metal layer using a sputtering method. As a result, the reliability of the metal layer of the semiconductor device can be maintained.

Additionally, the CVD metal layer having a planarized surface has a baking effect wherein impurities or gases remaining in the CVD metal layer are discharged by a heat-treatment in the vacuum. Therefore, the layer quality of the CVD metal layer is improved.

In the present invention, when the contact hole is filled up by the CVD method, large quantities of semiconductor wafers can be processed, which can reduce the cost of the manufactured semiconductor device due to the increased throughput of the processed semiconductor wafers.

In addition to this, heat-treatment in a vacuum prevents void formation. Thus, the contact hole can be completely filled up.

Further, forming a nucleation layer by appropriately selecting the composition thereof may prevent junction spiking owing to the reaction between the Al and the nucleation layer during the heat-treatment.

The method for forming a wiring layer of the present invention does not include a selective epitaxial growth method, which enables forming a wiring layer without any connection with the underlayer.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor device, comprising:

a substrate;

an insulating layer formed on said substrate;

an opening formed in said insulating layer, said opening including a bottom surface comprised of a portion of said substrate;

a composite diffusion barrier layer formed on said bottom surface of said opening and on walls of said insulating layer defining said opening, said composite diffusion barrier layer being comprised of at least first and second sub-layers;

a nucleation layer formed on said composite diffusion barrier layer, said nucleation layer including wing portions extending laterally outwardly beyond an upper edge of said opening and on adjacent surface portions of said insulating layer;

a first metal layer formed on said nucleation layer, said first metal layer including a plug portion filling said opening and wing portions which extend laterally outwardly beyond an upper edge of said opening and on said wing portions of said nucleation layer, said plug portion and said wing portions of said first metal layer being continuous and comprised of the same material;

an intermediate layer formed on said first metal layer; and, a second metal layer formed on said intermediate layer.

2. The semiconductor device as set forth in claim 1, wherein said nucleation layer is comprised of a silylation layer.

3. The semiconductor device as set forth in claim 1, wherein said nucleation layer is made of silicon.

4. The semiconductor device as set forth in claim 1, wherein said nucleation layer is made of copper.

5. The semiconductor device as set forth in claim 1, wherein said nucleation layer is made of a silicon-copper composite.

6. The semiconductor device as set forth in claim 1, wherein said first sub-layer of said composite diffusion barrier layer is comprised of a refractory metal, and said second sub-layer of said composite diffusion barrier layer is comprised of a refractory metal composite.

7. The semiconductor device as set forth in claim 6, wherein said refractory metal is titanium, and said refractory metal composite is titanium nitride.

8. The semiconductor device as set forth in claim 1, wherein said first and second sub-layers of said composite diffusion barrier layer are each comprised of a material selected from the group consisting of refractory metals and refractory metal composites.

9. The semiconductor device as set forth in claim 1, said composite diffusion barrier layer further comprising an oxide layer.

10. The semiconductor device as set forth in claim 1, wherein said substrate comprises a semiconductor substrate.

11. The semiconductor device as set forth in claim 9, wherein said substrate comprises a semiconductor substrate.

12. The semiconductor device as set forth in claim 1, wherein said nucleation layer is comprised of a hydrogen-treated layer.

13. The semiconductor device as set forth in claim 1, wherein said intermediate layer comprises a further diffusion barrier layer having a <111> crystal orientation.

* * * * *